(12) United States Patent
Kanazawa

(10) Patent No.: US 11,255,880 B2
(45) Date of Patent: Feb. 22, 2022

(54) VOLTAGE DETECTION CIRCUIT, SEMICONDUCTOR DEVICE, AND SEMICONDUCTOR DEVICE MANUFACTURING METHOD

(71) Applicant: ABLIC Inc., Chiba (JP)

(72) Inventor: Yusuke Kanazawa, Chiba (JP)

(73) Assignee: ABLIC INC., Chiba (JP)

( * ) Notice: Subject to any disclaimer, the term of this patent is extended or adjusted under 35 U.S.C. 154(b) by 142 days.

(21) Appl. No.: 16/519,694

(22) Filed: Jul. 23, 2019

(65) Prior Publication Data

US 2020/0033382 A1 Jan. 30, 2020

(30) Foreign Application Priority Data

Jul. 26, 2018 (JP) .............................. JP2018-140442

(51) Int. Cl.
| | | |
|---|---|---|
| *G01R 15/00* | (2006.01) | |
| *H01L 21/66* | (2006.01) | |
| *G01R 19/165* | (2006.01) | |
| *H03K 3/037* | (2006.01) | |
| *H03K 17/687* | (2006.01) | |
| *H03K 5/24* | (2006.01) | |

(52) U.S. Cl.
CPC ..... *G01R 15/005* (2013.01); *G01R 19/16576* (2013.01); *H01L 22/14* (2013.01); *H03K 3/037* (2013.01); *H03K 5/24* (2013.01); *H03K 17/687* (2013.01)

(58) Field of Classification Search
CPC .. G01R 15/005; G01R 19/16576; H01L 22/14
See application file for complete search history.

(56) References Cited

U.S. PATENT DOCUMENTS

| | | | |
|---|---|---|---|
| 10,126,766 B2 * | 11/2018 | Cho ..................... | H03K 5/1534 |
| 2004/0145957 A1 * | 7/2004 | Perner .................... | G11C 7/067 |
| | | | 365/209 |
| 2004/0222831 A1 * | 11/2004 | Mitsumoto ............. | H03L 7/191 |
| | | | 327/157 |
| 2009/0039973 A1 * | 2/2009 | Kitayama ............... | H03L 7/107 |
| | | | 331/36 C |
| 2012/0192623 A1 * | 8/2012 | Adami ............... | G01N 33/0031 |
| | | | 73/31.05 |
| 2014/0043006 A1 * | 2/2014 | Tan ........................ | H02M 3/157 |
| | | | 323/298 |
| 2020/0403570 A1 * | 12/2020 | Ii ............................. | H03B 5/04 |

FOREIGN PATENT DOCUMENTS

JP 2009-031093 A 2/2009

* cited by examiner

*Primary Examiner* — Dominic E Hawkins
(74) *Attorney, Agent, or Firm* — Crowell & Moring LLP

(57) ABSTRACT

A voltage detection circuit includes a resistance dividing circuit containing a coarse adjustment variable resistance circuit and a fine adjustment variable resistance circuit, a coarse adjustment circuit controlling the coarse adjustment variable resistance circuit, a fine adjustment circuit controlling the fine adjustment variable resistance circuit, and a control circuit controlling the coarse adjustment circuit and the fine adjustment circuit based upon a detection signal of a comparator circuit.

10 Claims, 6 Drawing Sheets

PRIOR ART

VOLTAGE DETECTION CIRCUIT, SEMICONDUCTOR DEVICE, AND SEMICONDUCTOR DEVICE MANUFACTURING METHOD

RELATED APPLICATIONS

Priority is claimed on Japanese Patent Application No. 2018-140442, filed on Jul. 26, 2018, the content of which is incorporated herein by reference.

BACKGROUND OF THE INVENTION

1. Field of the Invention

The present invention relates to a voltage detection circuit, a semiconductor device, and a semiconductor device manufacturing method.

2. Description of the Related Art

A voltage detection circuit compares a voltage obtained by dividing a voltage to be measured by a resistance dividing circuit with a reference voltage with a comparator to detect that the voltage to be measured reaches a predetermined voltage. In order to improve the voltage detection accuracy, the resistance dividing circuit has a variable resistance portion so that a resistance value thereof can be adjusted.

FIG. 6 is a circuit diagram illustrating a conventional voltage detection circuit 400 serving as an example of a conventional voltage detection circuit. The conventional voltage detection circuit 400 includes circuits adjusting the resistance value of a resistance dividing circuit 60. A control circuit 45 receives a test signal supplied from an input terminal 4 and then starts an operation of an oscillation circuit 43. The resistance dividing circuit 60 includes a variable resistance portion containing a series resistor in which the resistance is weighed and NMOS transistors as switch elements connected in parallel therewith. A divider circuit 44 outputs a control signal turning on/off each NMOS transistor in response to a clock signal of the oscillation circuit 43. The resistance dividing circuit 60 outputs a divided voltage obtained by dividing a voltage to be measured which is to be supplied into a voltage input terminal 1 in accordance with the ON/OFF of each NMOS transistor. A comparator 41 outputs a result of comparing the divided voltage with a reference voltage of the reference voltage circuit 42. The control circuit 45 stops the operation of the oscillation circuit 43 in response to the fact that the output signal of the comparator 41 has been inverted. Then, the resistance dividing circuit 60 determines the resistance value by maintaining the state of the variable resistance portion when the oscillation circuit 43 stops (for example, see Japanese Patent Application Laid-Open No. 2009-31093).

SUMMARY OF THE INVENTION

However, the conventional voltage detection circuit 400 sequentially selects and adjusts the series resistor in which the resistance is weighed of the variable resistance portion with a clock. Hence, if the number of the series resistor is defined as X, the conventional voltage detection circuit 400 spends time corresponding to $2^X$ clock at the maximum to adjust the resistance value of the variable resistance portion. Thus, the conventional voltage detection circuit 400 spends time for the adjustment of the resistance value of the variable resistance portion in a manufacturing process, and therefore the manufacturing cost increases.

It is an object of the present invention to provide a voltage detection circuit capable of reducing the adjustment time of a resistance value of a variable resistance portion in a manufacturing process.

A voltage detection circuit of an embodiment according to the present invention is a voltage detection circuit detecting that a voltage to be measured reaches a predetermined voltage and including a resistance dividing circuit which includes a coarse adjustment variable resistance circuit containing a variable resistor, configured to adjust a resistance thereof and a fine adjustment variable resistance circuit configured to adjust a resistance thereof, a comparator circuit supplying a detection signal obtained by comparing an output voltage of the resistance dividing circuit with a reference voltage, a coarse adjustment circuit configured to control the coarse adjustment variable resistance circuit, a fine adjustment circuit configured to control the fine adjustment variable resistance circuit, and a control circuit configured to control the coarse adjustment circuit and the fine adjustment circuit based upon the detection signal of the comparator circuit.

A semiconductor device of the embodiment according to the present invention is a semiconductor device including the voltage detection circuit.

A method for manufacturing a semiconductor device of the embodiment according to the present invention is a method for manufacturing a semiconductor device which includes a resistance dividing circuit including a coarse adjustment variable resistance circuit containing a variable resistor, configured to adjust a resistance thereof and a fine adjustment variable resistance circuit configured to adjust a resistance thereof, a comparator circuit configured to output a detection signal obtained by comparing an output voltage of the resistance dividing circuit with a reference voltage, a coarse adjustment circuit configured to control the coarse adjustment variable resistance circuit, a fine adjustment circuit configured to control the fine adjustment variable resistance circuit, and a control circuit configured to control the coarse adjustment circuit and the fine adjustment circuit based upon the detection signal of the comparator circuit, the method including forming the resistance dividing circuit, the comparator circuit, the coarse adjustment circuit, the fine adjustment circuit, and the control circuit, on a semiconductor substrate; making the coarse adjustment circuit operate by the control circuit; determining a resistance of the coarse adjustment circuit to stop the coarse adjustment circuit in response to the change of the detection signal; making the fine adjustment circuit operate by the control circuit; and determining a resistance of the fine adjustment circuit to stop the fine adjustment circuit in response to the change of the detection signal.

The voltage detection circuit according to the present invention can reduce the adjustment time of a resistance value of a variable resistance portion in a manufacturing process.

DETAILED DESCRIPTION OF THE PREFERRED EMBODIMENTS

Hereinafter, an embodiment of a voltage detection circuit according to the present invention will be described with reference to the drawings.

Figure 1:
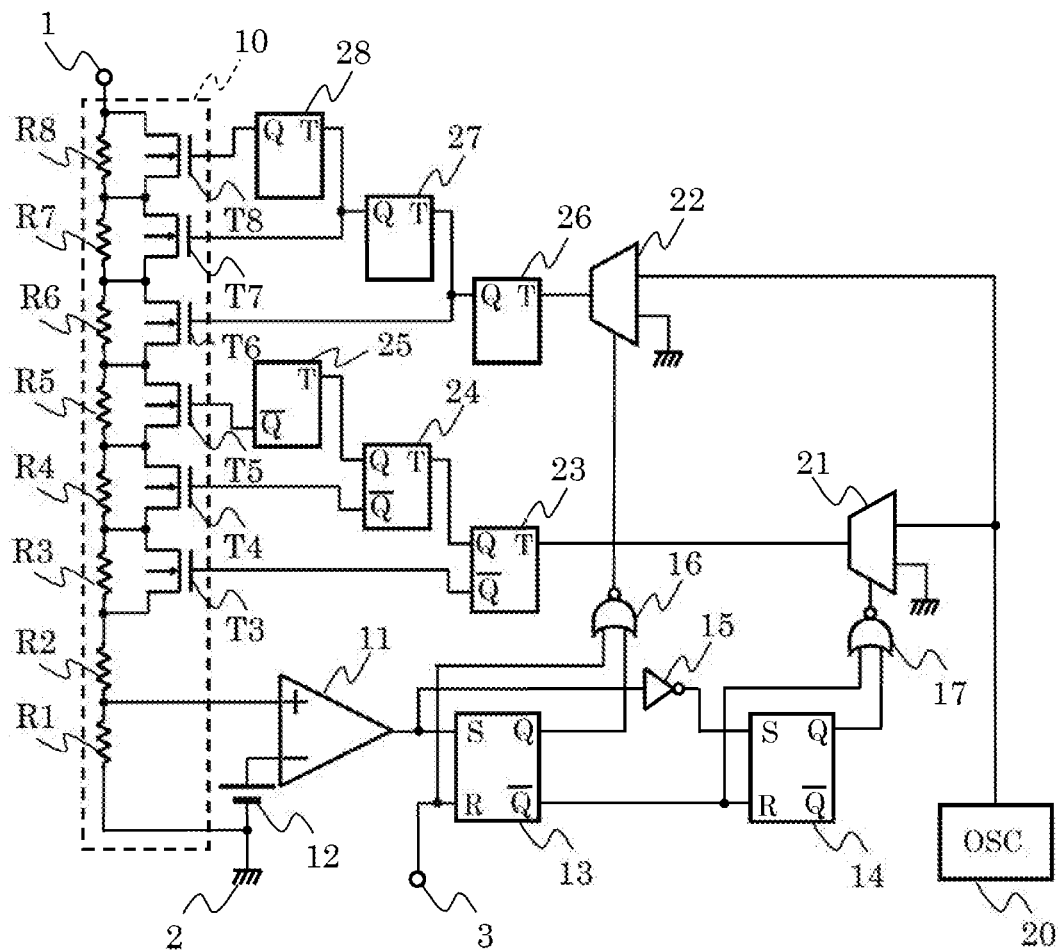
FIG. 1 is a circuit diagram illustrating the first configuration example of a voltage detection circuit of an embodiment according to the present invention.

FIG. 1 is a circuit diagram illustrating a voltage detection circuit 100 serving as a first configuration example of the voltage detection circuit according to the embodiment of the present invention. The voltage detection circuit 100 includes a resistance dividing circuit 10, a comparator 11, a reference voltage circuit 12, latch circuits 13 and 14, a NOT circuit 15, NOR circuits 16 and 17, an oscillation circuit 20, multiplexers 21 and 22, and TFF circuits 23 to 28. The resistance dividing circuit 10 includes resistor R1 to R8 and MOS transistors T3 to T8 as switch elements.

In the resistance dividing circuit 10, the resistors R1 to R8 are connected in series between a voltage input terminal 1 and an earth terminal 2, the MOS transistors T3 to T8 are connected in parallel with the resistors R3 to R8, respectively, and the connecting point of the resistor R1 and the resistor R2 serves as an output terminal. In the comparator 11, an output terminal of the reference voltage circuit 12 is connected to an inverted input terminal, an output terminal of the resistance dividing circuit 10 is connected to a non-inverted input terminal, and an output terminal is connected to a set terminal S of the latch circuit 13 and an input terminal of the NOT circuit 15. In the latch circuit 13, a reset terminal 3 is connected to a reset terminal R, an output terminal Q is connected to one input terminal of the NOR circuit 16, and an output terminal/Q (which represents Q-bar) is connected to one input terminal of the NOR circuit 17 and a reset terminal R of the latch circuit 14. To the other input terminal of the NOR circuit 16, the reset terminal 3 is connected. In the latch circuit 14, an output terminal of the NOT circuit 15 is connected to a set terminal S and an output terminal Q is connected to the other input terminal of the NOR circuit 17.

In the multiplexer 21, an output terminal of the oscillation circuit 20 is connected to one input terminal, the earth terminal 2 is connected to the other input terminal, and an output terminal of the NOR circuit 17 is connected to a control terminal. In the multiplexer 22, the output terminal of the oscillation circuit 20 is connected to one input terminal, the earth terminal 2 is connected to the other input terminal, and an output terminal of the NOR circuit 16 is connected to a control terminal.

In the TFF circuit 23, an output terminal of the multiplexer 21 is connected to an input terminal T, an output terminal Q is connected to an input terminal T of the TFF circuit 24, and an output terminal/Q is connected to a gate of the MOS transistor T3. In the TFF circuit 24, an output terminal Q is connected to an input terminal T of the TFF circuit 25 and an output terminal/Q is connected to a gate of the MOS transistor T4. An output terminal/Q of the TFF circuit 25 is connected to a gate of the MOS transistor T5.

In the TFF circuit 26, an output terminal of the multiplexer 22 is connected to an input terminal T and an output terminal Q is connected to an input terminal T of the TFF circuit 27 and a gate of the MOS transistor T6. In the TFF circuit 27, an output terminal Q is connected to an input terminal T of the TFF circuit 28 and a gate of the MOS transistor T7. An output terminal Q of the TFF circuit 28 is connected to a gate of the MOS transistor T8.

Herein, the resistors R3 to R8 and the MOS transistors T3 to T8 constitute a variable resistance circuit. With respect to the resistance of each resistor R1 to R8 in the resistance dividing circuit 10, if the resistance of the resistor R6 is defined as r, for example, the resistors R1 and R2 have a resistance 10r, the resistor R3 has a resistance r/8, the resistor R4 has a resistance r/4, the resistor R5 has a resistance r/2, the resistor R7 has a resistance 2r, and the resistor R8 has a resistance 4r. Specifically, in the resistors constituting the variable resistance circuit, the resistance value is weighed. More specifically, the resistors R6 to R8 and the MOS transistors T6 to T8 constitute a coarse adjustment variable resistance circuit. The TFF circuits 26 to 28 and the multiplexer 22 constitute a coarse adjustment circuit. The resistors R3 to R5 and the MOS transistors T3 to T5 constitute a fine adjustment variable resistance circuit. The TFF circuits 23 to 25 and the multiplexer 21 constitute a fine adjustment circuit. The latch circuits 13 and 14 are constituted so that, when the reset terminals R are at an H level, the latch circuits 13 and 14 are in a reset state and the output terminals Q output an L level and, when the set terminals S become an H level when the reset terminals R are at an L level, the output terminal Q outputs an L level. The latch circuits 13 and 14, the NOT circuit 15, and the NOR circuits 16 and 17 constitute a control circuit switching the operations of the coarse adjustment circuit and the fine adjustment portion.

Hereinafter, an operation of the voltage detection circuit 100 constituted as described above is described.

Figure 2:
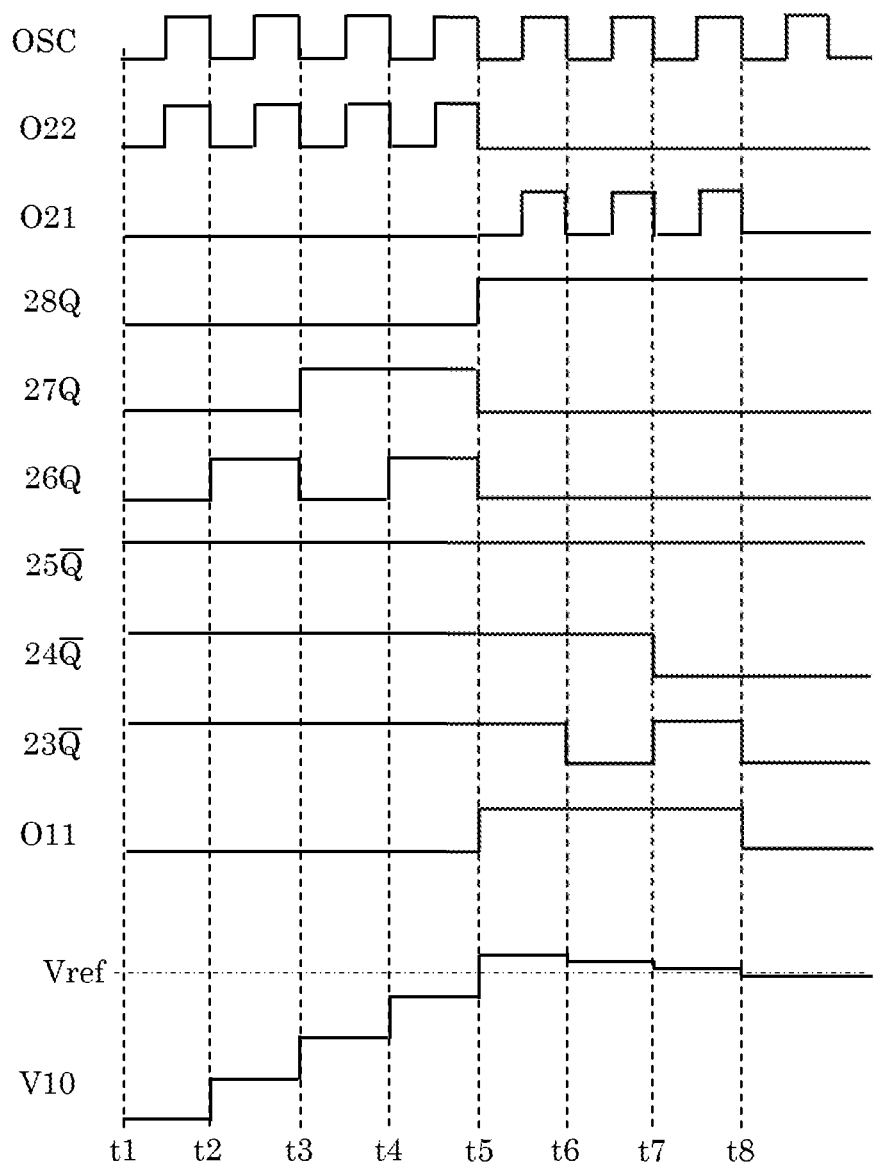
FIG. 2 is a timing chart illustrating an operation of the first configuration example of the voltage detection circuit.

FIG. 2 is a timing chart illustrating the operation of the voltage detection circuit 100.

In FIG. 2, OSC is an output waveform of the oscillation circuit 20, O22 is an output waveform of the multiplexer 22, O21 is an output waveform of the multiplexer 21, 28Q to 26Q are output signals of the output terminals Q of the TFF circuits 28 to 26, respectively, 25/Q to 23/Q are output signals of the output terminals/Q of the TFF circuits 25 to 23, respectively, V10 is an output voltage of the resistance dividing circuit 10, Vref is a reference voltage of the reference voltage circuit 12, and O11 is an output signal of the comparator 11.

Before time t1, the TFF circuits 28 to 23 are initialized. That is, the output signals of the output terminals Q of the TFF circuits 28 to 26 are at an L level and the MOS transistors T8 to T6 of the resistance dividing circuit 10 are turned off. The output signals of the output terminals/Q of the TFF circuits 25 to 23 are at an H level and the MOS transistors T5 to T3 of the resistance dividing circuit 10 are turned on.

Since an H level reset signal is supplied into the reset terminal 3, the NOR circuit 16 outputs an L level to set the output O22 to an L level of the earth terminal 2. Since an H level is supplied from the output terminal/Q of the latch circuit 13, the NOR circuit 17 outputs an L level to set the output O21 to an L level of the earth terminal 2.

At the time t1, the reset signal is switched to an L level. In a state where the reset signal is at the L level, the latch circuit 13 supplies a signal at an L level from the output terminal Q thereof, and therefore the NOR circuit 16 supplies a signal at an H level to switch the output O22 to an output of the oscillation circuit 20. Until time t2, the MOS transistors T5 to T3 are turned on. Here, if the voltage to be measured which is to be supplied from the voltage input terminal 1 is defined as Vin, the output voltage V10 of the resistance dividing circuit 10 is given by Vin(10r/(10r+10r+4r+2r+r)).

At the time t2, the 26Q is switched to an H level. In a state where the 26Q is at the H level, the MOS transistor T6 is turned on, and therefore the output voltage V10 is given by Vin(10r/(10r+10r+4r+2r)). Hence, the MOS transistors T6 to T8 are turned on/off in accordance with a signal to be supplied into the gates until the output voltage V10 exceeds the reference voltage Vref, i.e., time t5.

At the time t5, the MOS transistor T8 is turned off, the MOS transistors T7 and T6 are turned on, the output voltage V10 is given by Vin(10r/(10r+10r+2r+r)), and the output voltage V10 exceeds the reference voltage Vref, so that the output signal O11 is switched to an H level. In a state where the output signal O11 is at the H level, since each of the set terminal S and the output terminal Q of the latch circuit 13 becomes an H level, the NOR circuit 16 supplies a signal at an L level, so that the output of the multiplexer 22 is fixed to an L level of the earth terminal 2. Since the output terminal/Q of the latch circuit 13 becomes an L level and the output terminal Q of the latch circuit 14 is at an L level, the NOR circuit 17 supplies a signal at an H level to switch the output O21 to the output of the oscillation circuit 20. Up to this point, the coarse adjustment of the resistance dividing circuit 10 is completed, and then the fine adjustment of the resistance dividing circuit 10 is started.

At time t6, the MOS transistor T3 is turned off by providing the 23/Q which is at an L level, and therefore the output voltage V10 is given by Vin(10r/(10r+10r+4r+2r+r/8)). Hence, the MOS transistors T3 to T5 are turned on/off until the output voltage V10 is less than the reference voltage Vref, i.e., time t8.

At the time t8, the MOS transistor T5 is turned on, the MOS transistors T4 and T3 are turned off, the output voltage V10 is given by Vin(10r/(10r+10r+2r+r+r/8+r/4)), and the output voltage V10 is less than the reference voltage Vref, so that the output signal O11 becomes an L level. Since each of the set terminal S and the output terminal Q of the latch circuit 14 becomes an H level, the NOR circuit 17 supplies an L level and the output of the multiplexer 21 is fixed to an L level of the earth terminal 2.

Hence, at the time t5, the outputs of the multiplexers 21 and 22 are fixed to an L level and the ON/OFF of the MOS transistors T3 to T8 is fixed, so that the coarse adjustment and the fine adjustment of the resistance dividing circuit 10 are completed.

As described above, in the case of the example illustrated in FIG. 2, the voltage detection circuit 100 completes the adjustment of the resistance in the resistance dividing circuit 10 only with four clocks for the coarse adjustment and three clocks for the fine adjustment. The resistance value can be adjusted in a short time as compared with the case where the resistance dividing circuit 60 is set to the same resistance value, i.e., the resolution of R/8, in the conventional voltage detection circuit 400.

Figure 3:
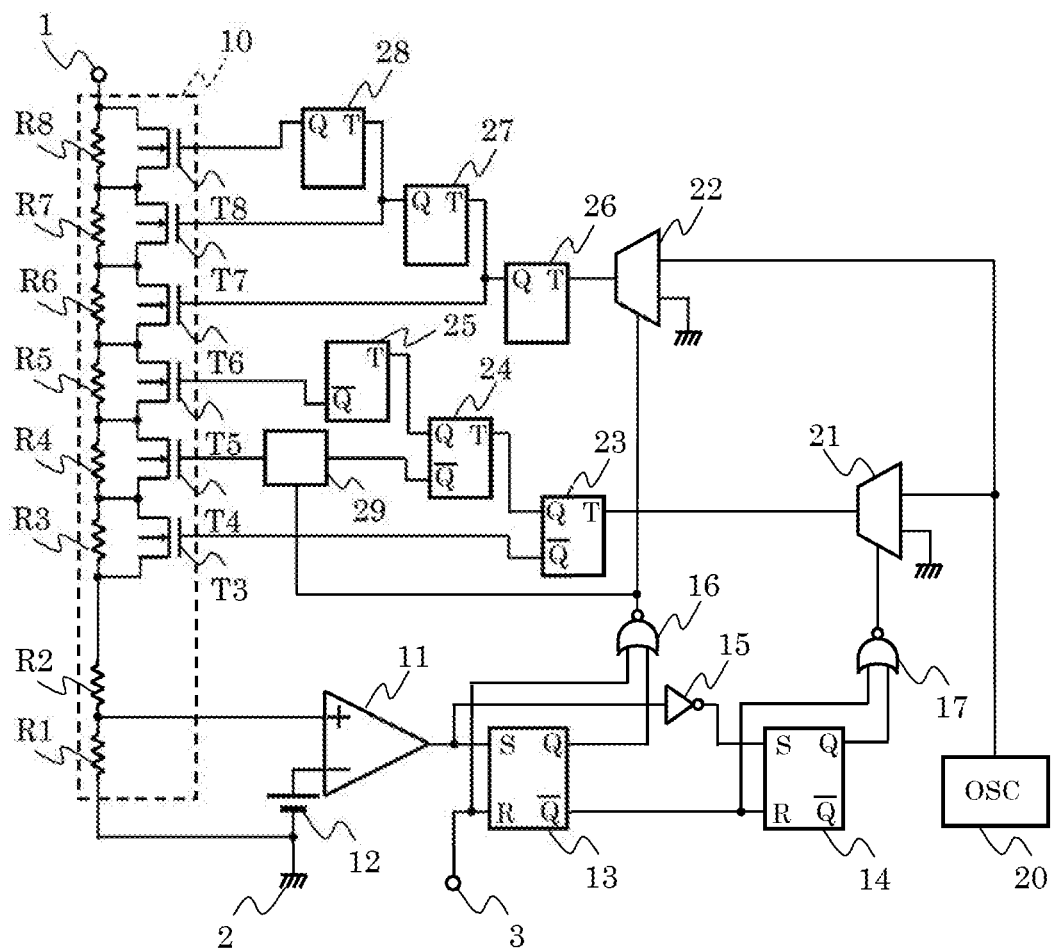
FIG. 3 is a circuit diagram illustrating the second configuration example of the voltage detection circuit of the embodiment.

FIG. 3 is a circuit diagram illustrating a voltage detection circuit 200 serving as the second configuration example of the voltage detection circuit of the embodiment. The voltage detection circuit 200 includes an output control circuit 29 in addition to the voltage detection circuit 100. The output control circuit 29 is interposed between the output terminal/Q of the TFF circuit 24 and the gate of the MOS transistor T5.

Since the other components of the voltage detection circuit 200 are the same as those of the voltage detection circuit 100, the same constituent components are designated by the same reference numerals and a redundant description is omitted as appropriate.

In the voltage detection circuit 100, there is a case of erroneous determination of the comparator 11 under the influence of noise and the like in the coarse adjustment. In this case, if the actual output voltage V10 of the resistance dividing circuit 10 is lower than the reference voltage Vref, fine adjustment is not performed and an error thus increases to a desired resistance value. The output control circuit 29 is a circuit provided in order to deal with the erroneous determination of the comparator 11 in the coarse adjustment.

In the output control circuit 29, an input terminal is connected to the output terminal/Q of the TFF circuit 24, an output terminal is connected to the gate of the MOS transistor T4, and a control terminal is connected to the output terminal of the NOR circuit 16. The output control circuit 29 supplies an L level signal irrespective of a signal provided from the input terminal if an H level signal is supplied into the control terminal and supplies the signal of the input terminal if an L level signal is supplied into the control terminal.

Hereinafter, an operation of the voltage detection circuit 200 constituted as described above is described.

Figure 4:
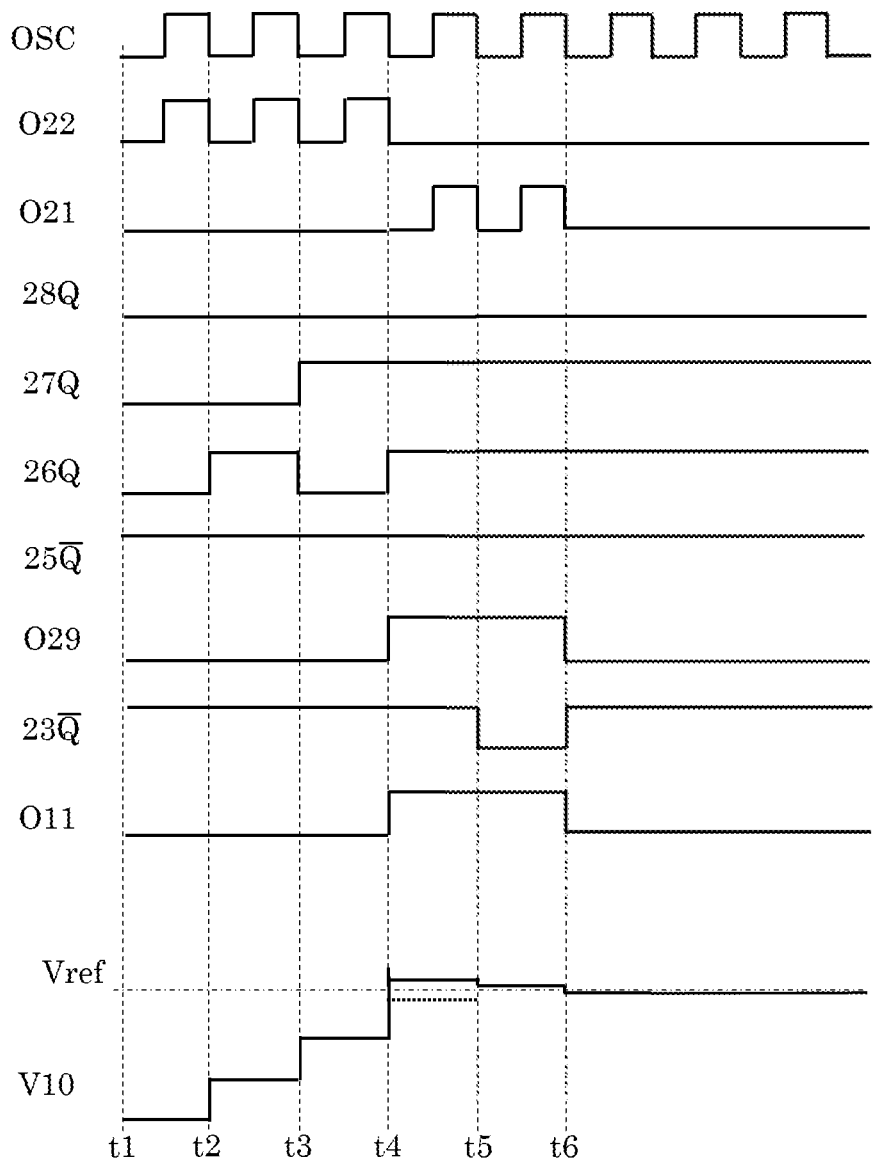
FIG. 4 is a timing chart illustrating the operation of the second configuration example of the voltage detection circuit.

FIG. 4 is a timing chart illustrating an operation of the voltage detection circuit 200. O29 is an output signal of the output control circuit 29.

An operation before time t4 in the timing chart of FIG. 4 is the same as that in the timing chart of FIG. 2 except a signal of the gate of the MOS transistor T5. An L level output signal O29 is supplied into the gate of the MOS transistor T5.

At the time t4, if the output voltage V10 of the resistance dividing circuit 10 exceeds the reference voltage Vref due to the mixing of a noise in spite of not exceeding the reference voltage Vref in fact (voltage indicated by the dotted line between the time t4 and t5 in FIG. 4), the output signal O11 becomes an H level. If the output signal O11 becomes an H level, the output terminal Q of the latch circuit 13 becomes an H level, the output of the NOR circuit 16 becomes an L level, and then the coarse adjustment portion stops the operation. The output voltage V10 of the resistance dividing circuit 10 at this time is given by Vin(10r/(10r+10r+4r+r/2)).

Herein, in the output control circuit 29, an L level signal is supplied into the control terminal, and therefore an H level which is a signal of the output terminal/Q of the TFF circuit 24 is supplied from the output terminal. The MOS transistor T4 receives the H level and is therefore turned on, so that the output voltage V10 of the resistance dividing circuit 10 is given by Vin(10r/(10r+10r+4r)). Hence, the output voltage V10 of the resistance dividing circuit 10 becomes a voltage exceeding the reference voltage Vref, which is indicated by the solid line of the figure. More specifically, the output control circuit 29 of the fine adjustment portion applies an offset voltage to the output voltage V10 of the resistance dividing circuit 10 in the coarse adjustment of a variable resistance circuit.

Then, from the time t4 to the time t6, the fine adjustment portion normally operates, so that the fine adjustment of the resistance dividing circuit 10 is completed. As described above, since the signal of the gate of the MOS transistor T4 is set so as to have a different value when the adjustment is switched from the coarse adjustment to the fine adjustment, the fine adjustment is performed even if the comparator 11 performs erroneous determination under the influence of noise and the like in the coarse adjustment, whereby an error of a resistance value can be reduced.

As described above, the voltage detection circuit of the embodiment includes the coarse adjustment circuit coarsely adjusting the variable resistance circuit, the fine adjustment circuit finely adjusting the variable resistance circuit, and the control circuit controlling the coarse adjustment circuit and the fine adjustment circuit according to the detection signal of the comparator circuit, and is therefore possible to reduce the adjustment time of the resistance of the variable resistance portion in a manufacturing process. It is noted that the embodiment of the present invention is described by illustrating the voltage detection circuits 100 and 200 but the present invention is not limited to the above-described embodiment and can be variously altered without deviating from the scope of the present invention.

For example, in the above-described embodiment, the coarse adjustment resistance and the fine adjustment resistance each are constituted by three resistors but the resistors may be provided as appropriate according to desired range and resolution. Moreover, the adjustment range of the fine adjustment variable resistance circuit is set to be equal to the adjustment range of the resistor having a minimum resistance in the coarse adjustment variable resistance circuit but may be enlarged.

Moreover, for example, the circuit configurations of the control portion, the coarse adjustment portion, and the fine adjustment portion are constituted by the latch circuit, the multiplexer, the TFF circuit, and the like but may have any configuration insofar as the circuit achieves the object of the present invention. Moreover, for example, although the embodiment is constituted by the coarse adjustment portion and the fine adjustment portion, a larger number of adjustment portions may be provided.

Moreover, for example, although the resistance value of the resistance dividing circuit 10 is controlled when the adjustment is switched from the coarse adjustment to the fine adjustment in the embodiment of FIG. 3, the voltage Vin to be measured and the reference voltage Vref may be switched.

Figure 5:
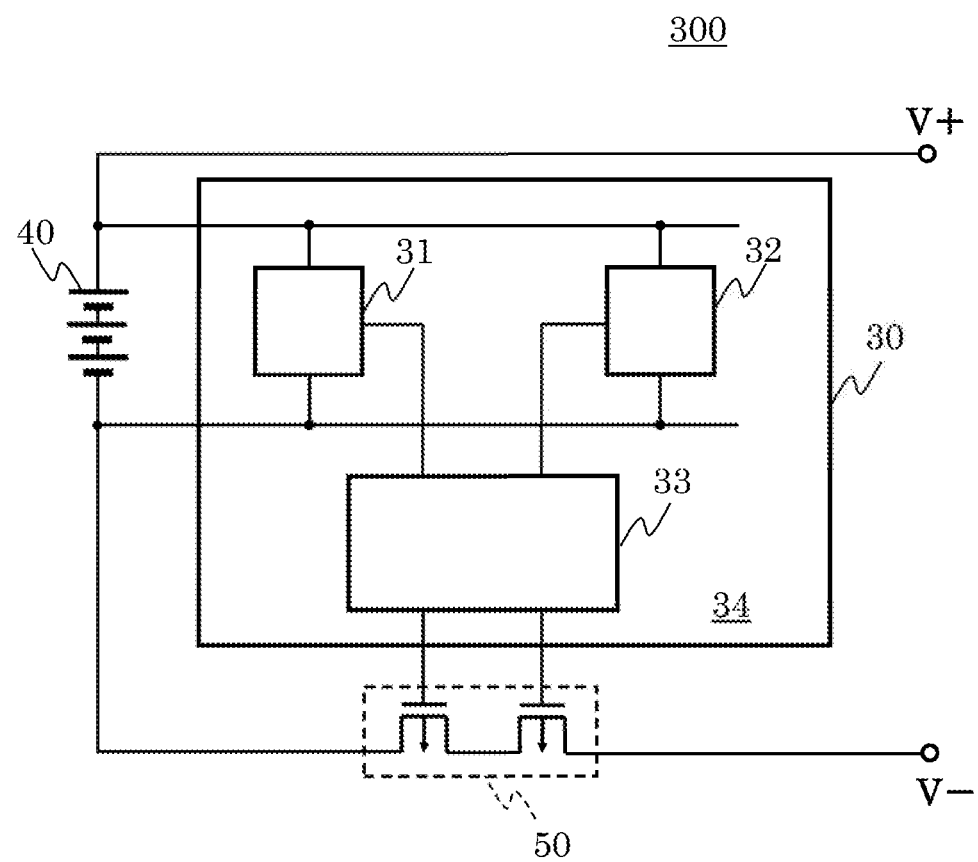
FIG. 5 is a block diagram illustrating a battery device including a battery state monitor containing the voltage detection circuit of the embodiment and a semiconductor device of the embodiment.
Figure 6:
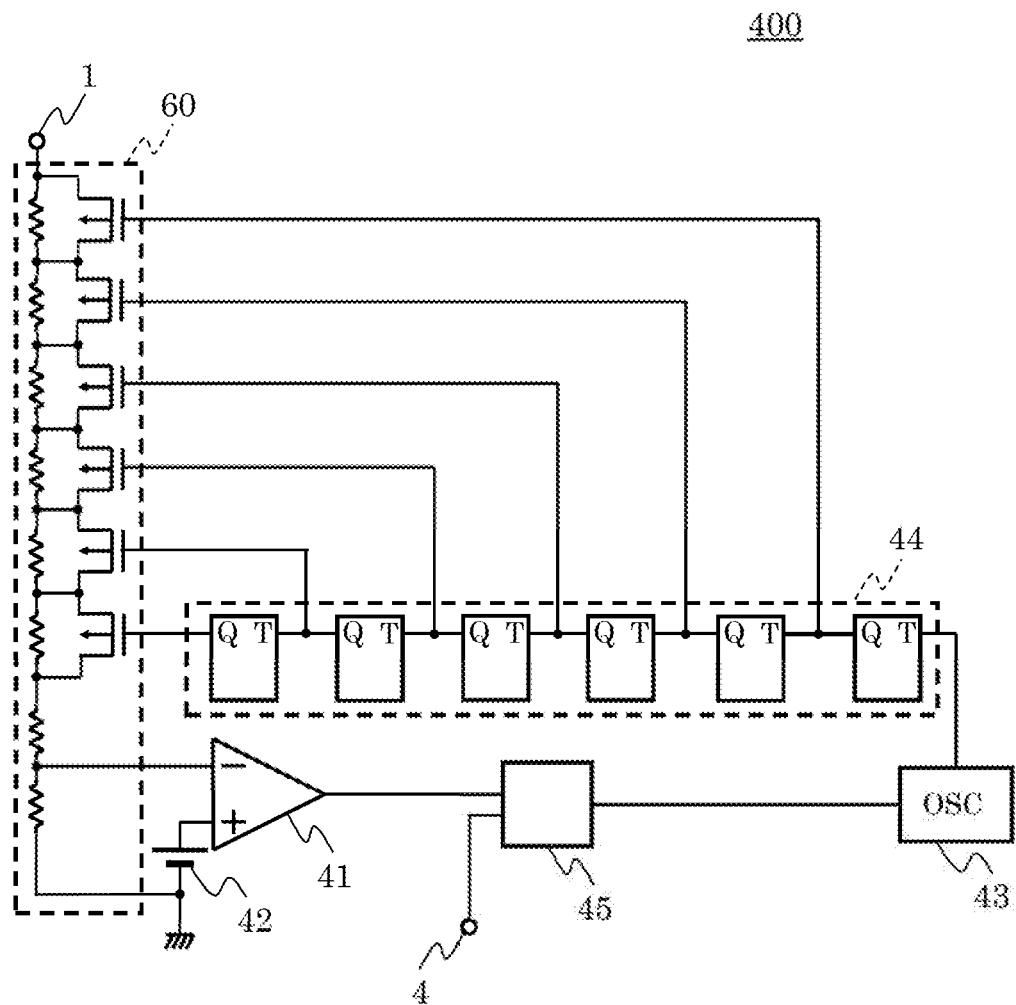
FIG. 6 is a circuit diagram illustrating a configuration example of a conventional voltage detection circuit.

The voltage detection circuit of the present invention is suitable for a semiconductor device in which the voltage detection accuracy is demanded, e.g., a battery state monitoring circuit of a secondary battery and the like. FIG. 5 is a block diagram illustrating a battery device 300 including a battery state monitor 30 containing the voltage detection circuit of the embodiment according to the present invention and a semiconductor device of the embodiment.

The battery device 300 includes a secondary battery 40 and a charge/discharge control switch 50 connected between external terminals V+ and V− and a battery state monitor 30 monitoring a voltage and the like of the secondary battery 40 to control the charge/discharge control switch 50. The battery state monitor 30 serving as the semiconductor device of the embodiment contains an overcharge detection circuit 31, an overdischarge detection circuit 32, and a control circuit 33. The battery state monitor 30 is forming on a semiconductor substrate 34. The overcharge detection circuit 31 and the overdischarge detection circuit 32 can increase the voltage detection accuracy by the use of the voltage detection circuit of the present invention, so that the performance of the battery state monitor 30 is improved and the safety of the battery device 300 increases.

As described above, application examples of the voltage detection circuit of the present invention are described with reference to the battery state monitoring circuit and the battery device but are not limited thereto insofar as the voltage detection circuit of the present invention is applied to a semiconductor device in which the voltage detection accuracy is demanded. For example, the voltage detection circuit of the present invention may be used for a voltage stabilization circuit of a power supply device and the like.

What is claimed is:

1. A voltage detection circuit which detects that a voltage to be measured reaches a predetermined voltage, the voltage detection circuit comprising:
   a resistance dividing circuit which includes a coarse adjustment variable resistance circuit containing a variable resistor, configured to adjust a resistance thereof and a fine adjustment variable resistance circuit configured to adjust a resistance thereof;
   a comparator circuit configured to output a detection signal obtained by comparing an output voltage of the resistance dividing circuit with a reference voltage;
   a coarse adjustment circuit configured to control the coarse adjustment variable resistance circuit;
   a fine adjustment circuit configured to control the fine adjustment variable resistance circuit and have an adjustment range of the fine adjustment variable resistance circuit, being wider than an adjustment range of a resistance having a minimum resistance value constituting the coarse adjustment variable resistance circuit; and
   a control circuit configured to control the coarse adjustment circuit and the fine adjustment circuit based upon the detection signal of the comparator circuit.

2. The voltage detection circuit according to claim 1, wherein the control circuit is configured to operate the coarse adjustment circuit, then stop the coarse adjustment circuit and operate the fine adjustment circuit in response to a change in the detection signal of the comparator circuit, and then stop the fine adjustment circuit in response to a next change in the detection signal of the comparator circuit.

3. The voltage detection circuit according to claim 2, wherein the fine adjustment circuit is configured to apply an offset voltage to an output voltage of the resistance dividing circuit while the coarse adjustment circuit is operating.

4. The voltage detection circuit according to claim 2, wherein an offset voltage is applied to the reference voltage while the coarse adjustment circuit is operating.

5. A semiconductor device comprising:
   the voltage detection circuit according to claim 1.

6. A voltage detection circuit which detects that a voltage to be measured reaches a predetermined voltage, the voltage detection circuit comprising:
   a resistance dividing circuit which includes a coarse adjustment variable resistance circuit containing a variable resistor, configured to adjust a resistance thereof and a fine adjustment variable resistance circuit configured to adjust a resistance thereof;
   a comparator circuit configured to output a detection signal obtained by comparing an output voltage of the resistance dividing circuit with a reference voltage;
   a coarse adjustment circuit configured to control the coarse adjustment variable resistance circuit;
   a fine adjustment circuit configured to control the fine adjustment variable resistance circuit; and
   a control circuit configured to operate the coarse adjustment circuit, and then stop the coarse adjustment circuit and operate the fine adjustment circuit in response to a change in the detection signal of the comparator circuit, and then stop the fine adjustment circuit in response to a next change in the detection signal of the comparator circuit based upon the detection signal of the comparator circuit.

7. The voltage detection circuit according to claim 6, wherein the fine adjustment circuit is configured to apply an offset voltage to an output voltage of the resistance dividing circuit while the coarse adjustment circuit is operating.

8. The voltage detection circuit according to claim 6, wherein an offset voltage is applied to the reference voltage while the coarse adjustment circuit is operating.

9. A semiconductor device comprising:
the voltage detection circuit according to claim 6.

10. A method for manufacturing a semiconductor device which includes a resistance dividing circuit including a coarse adjustment variable resistance circuit containing a variable resistor, configured to adjust a resistance thereof and a fine adjustment variable resistance circuit configured to adjust a resistance thereof, a comparator circuit configured to output a detection signal obtained by comparing an output voltage of the resistance dividing circuit with a reference voltage, a coarse adjustment circuit configured to control the coarse adjustment variable resistance circuit, a fine adjustment circuit configured to control the fine adjustment variable resistance circuit, and a control circuit configured to control the coarse adjustment circuit and the fine adjustment circuit based upon the detection signal of the comparator circuit, the method comprising:

forming the resistance dividing circuit, the comparator circuit, the coarse adjustment circuit, the fine adjustment circuit, and the control circuit, on a semiconductor substrate;

making the coarse adjustment circuit operate by the control circuit;

determining a resistance of the coarse adjustment circuit to stop the coarse adjustment circuit in response to the change of the detection signal;

making the fine adjustment circuit operate by the control circuit; and determining a resistance of the fine adjustment circuit to stop the fine adjustment circuit in response to the change of the detection signal.

* * * * *